United States Patent [19]
Kida et al.

[11] Patent Number: 5,109,266
[45] Date of Patent: Apr. 28, 1992

[54] SEMICONDUCTOR INTEGRATED CIRCUIT DEVICE HAVING HIGH BREAKDOWN-VOLTAGE TO APPLIED VOLTAGE

[75] Inventors: Takeshi Kida; Goro Mitarai, both of Itami, Japan

[73] Assignee: Mitsubishi Denki Kabushiki Kaisha, Tokyo, Japan

[21] Appl. No.: 650,569

[22] Filed: Feb. 5, 1991

[30] Foreign Application Priority Data

Feb. 13, 1990 [JP] Japan .................................. 1-32792

[51] Int. Cl.$^5$ ..................... H01L 29/40; H01L 29/34; H01L 27/02; H01L 29/06
[52] U.S. Cl. ........................................ 357/53; 357/52; 357/51; 357/47; 357/55
[58] Field of Search ...................... 357/53, 52, 47, 51, 357/55

[56] References Cited

U.S. PATENT DOCUMENTS 4,292,642  9/1981  Appels et al. .......................... 357/13
4,868,819  9/1989  Kimura ................................. 369/33

OTHER PUBLICATIONS

Adler et al., "The Evolution of Power Device Technology", IEEE Transaction on Electron Devices, vol. ED-31, No. 11 (Nov. 1984), pp. 1570-1591.
R. Gallagher, "Linear IC Technology Can Withstand Over 400 Volts", Electronics International (Mar. 22, 1984), pp. 73-74.

*Primary Examiner*—Mark Prenty
*Attorney, Agent, or Firm*—Lowe, Price, LeBlanc & Becker

[57] ABSTRACT

A semiconductor integrated circuit device according to the present invention has a field plate disposed between the element isolation region which surrounds a semiconductor active element and an electrode wiring which is disposed to traverse the element isolation region while being electrically connected with the semiconductor active element, and a predetermined voltage is applied to the field plate. Accordingly, a concentration of the electric field is relieved not only at the boundary region between the element isolating region and the surface of the semiconductor active element which the electrode wiring traverses, but also at the surface of the semiconductor active element under the edge of the field plate, which eventually makes it possible to raise the breakdown-voltage of the semiconductor integrated circuit device.

9 Claims, 9 Drawing Sheets

SEMICONDUCTOR INTEGRATED CIRCUIT DEVICE HAVING HIGH BREAKDOWN-VOLTAGE TO APPLIED VOLTAGE

BACKGROUND OF THE INVENTION

1. Field of the Invention

The present invention relates to a semiconductor integrated circuit device having high breakdown-voltage to applied voltage.

2. Description of the Prior Art

FIG. 11 is a plan view showing a conventional semiconductor integrated circuit device disclosed in Japanese Unexamined Utility Model Publication No. 131152/1988; FIG. 12 is a sectional view of the conventional semiconductor integrated circuit device shown in FIG. 11. The semiconductor integrated circuit device will be described with an example of an npn bipolar transistor device. In FIG. 11, an insulation layer is omitted for convenience of understanding. Similarly, FIGS. 2, 5, 8, 10, 11 and 14 omit insulation layers.

In FIGS. 11 and 12, the npn bipolar transistor device, as well known, is composed of a substrate 1 consisting of a semiconductor layer 101 and an n⁻-type epitaxial layer 102, an n⁺-type buried layer 2, a collector region 3 of an n⁻-type epitaxial layer formed on the substrate 1, a p-type base region 4, an element isolating region of a p⁺-type diffusion layer, an insulation layer 6, a base-lead-out electrode 8 lead out through a contact hole 7, and electrode wiring 10 which is electrically connected with the base-lead-out electrode 8 through a through hole 9 and which traverses the element isolating region 5 to connect with an external terminal. The conventional npn bipolar transistor device further comprises a field plate 12 which is disposed in the insulation layer 6 above a channel region of a parasitic MOS transistor while being connected to the element isolating region 5 through a contact hole 11. The element isolating region 5 is connected to a ground terminal 13. Additionally, an emitter region and another lead-out electrode, for example, are required; but these are all omitted in the drawings because they are not essential in the explanation of the conventional device.

The operation of the conventional device will be explained below.

In the structure in which the electrode wiring 10 connected to the external terminal traverses the element isolating region 5 as shown in FIGS. 11 and 12, static electricity by which the ground terminal 13 turns to positive potential while the base region 4 turns to negative potential may be applied from outside. If the field plate 12 is not provided, when such static electricity is applied from outside, a parasitic MOS transistor in which the element isolating region 5 serves as a source, the base region 4 serves as a drain and the upper layer part of the collector region 3 serves as a channel region will be produced. However, since the conventional device is provided with the field plate 12 which blocks the collector region 3 between the element isolating region 5 and the base region 4 from the electrode wiring 10 while being connected to the element isolating region 5 which is grounded, there is formed no channel around the surface of the collector region 3 which is in contact with the insulating layer 6, so that the operation of the parasitic MOS transistor is inhibited. In this way, it is arranged that the semiconductor device should not be broken.

In the semiconductor integrated circuit device as stated above, a drop of the breakdown-voltage of the semiconductor integrated circuit device because of the parasitic MOS transistor is inhibited. However, when it is desired to enhance the voltage applied to the electrode wiring 10 close to the breakdown-voltage of the bulk of the pn-junction material as a high breakdown-voltage IC, since the field plate 12 is connected with the element isolating region 5, the field plate 12 will be at ground potential to have a large difference in potential from the electrode wiring 10, and the potential in the surface of the collector region 3 will change rapidly under the edge of the field plate 12 which the electrode wiring 10 traverses. As a result, a concentration of the electric field in the collector region 3 under the edge of the field plate 12 will be more significant than in the remaining collector region and the boundary region between the element isolating region 5 and the collector region 3, and there will be arise the problem that the breakdown-voltage of the semiconductor integrated circuit device cannot be enhanced close to the breakdown-voltage of the substrate thereof.

The drop of the breakdown-voltage as stated above is not necessarily caused merely in bipolar transistor devices but in diode devices, as shown in FIGS. 13 and 14, which have a structure where an element isolation is effected by the pn junction while a field plate disposed in an insulation layer is connected to an element isolating region.

Referring to FIGS. 13 and 14, an n⁺-type semiconductor region 21 is disposed close to the surface of the substrate 1 consisting of a semiconductor layer 101 and an n⁻-type epitaxial layer 102 connected to the semiconductor layer 101. In order to isolate semiconductor active elements, an element isolating region 5 of p⁺-type diffusion layer is disposed in a substrate 1. An insulation layer 6 is disposed on the surfaces of the substrate 1 and element isolating region 5. A contact hole 22 is provided in the insulation layer 6 on the n⁺-type semiconductor region 21, and electrode wiring 10 is formed on the insulation layer 6 to traverse the element isolating region 5 and connected electrically with the semiconductor region 21 through the contact hole 22. In the insulation layer 6, a field plate 12 buried so as to be in contact with the surface of the element isolating region 5 through a contact hole 11 is disposed along the electrode wiring 10 so that it blocks the element isolating region 5 and the boundary region between the element isolating region 5 and the substrate 1 from the electrode wiring 10. The element isolating region 5 is at ground potential, while voltage $V_B$ is applied to the n⁺-type semiconductor region 21 through the electrode wiring 10.

Assuming that a high breakdown-voltage diode technique which employs a thin epitaxial layer disclosed in the U.S. Pat. No. 4,292,642 is used in manufacturing a junction diode and that there is no electrode wiring 10 traversing the element isolating region 5 through insulation layer 6 in the diode device, the breakdown-voltage of the diode device is determined depending on the breakdown-voltage at the junction surface of the semiconductor layer 101 with the n⁻-type epitaxial layer 102 in the substrate 1. For example, when the resistivity and the thickness of the n⁻-type epitaxial layer 102 is 5Ω cm and 15 μm respectively and the resistivity of the semiconductor layer 101 is 40Ω cm, the breakdown-voltage of the diode is approximately 650 V.

Thus, when, in the diode device originally having the breakdown-voltage of about 650 V, the electrode wiring 10 traversing the p+-type element isolating region 5 through the insulation layer 6 as shown in FIGS. 13 and 14 is provided while the field plate 12 buried in the insulation layer 6 is connected to the surface of the element isolating region 5 through the contact hole 11, the field plate 12 comes to be at ground potential to have a large difference in potential from the electrode wiring 10, and the potential at the surface of the n−-type epitaxial layer 102 under the edge of the field plate 12 which the electrode wiring 10 traverses rapidly changes. As a result, a concentration of the electric field at the surface of the epitaxial layer 102 under the edge of the field plate 12 becomes more significant than in the boundary region between the element isolating region 5 and the epitaxial layer 102, so that the breakdown-voltage of the diode device drops. For example, the breakdown-voltage under the conditions that the insulation layer 6 under the field plate 12 has the thickness $t_{01}$ of 1 μm while the insulation layer 6 under the electrode wiring 10 has the thickness $t_{02}$ of 3 μm, is approximately 430 V, and this is a drop of about 220 V comparing with a case where the electrode wiring 10 does not traverse the element isolating region 5. FIG. 15 shows the relations between the thickness $t_{01}$ and the breakdown-voltage under the above conditions.

The drop of the breakdown-voltage because of the structure where the element isolation is effected by the pn junction while the field plate in the insulation layer is connected to the element isolating region is a general problem in a semiconductor integrated circuit device.

SUMMARY OF THE INVENTION

The present invention is directed to a semiconductor integrated circuit device having high breakdown-voltage to applied voltage.

The inventive semiconductor integrated circuit comprises: a substrate having a main surface; a semiconductor active element formed in the main surface of the substrate; an element isolating region formed in the substrate to surround the semiconductor active element; an insulation layer formed on the main surface of the substrate and the element isolating region; an electrode wiring formed on the insulation layer to traverse the element isolating region through the insulation layer and connected electrically with the semiconductor active element; and a field plate disposed along the electrode wiring in the insulation layer to traverse the element isolating region, predetermined voltage being applied to the field plate.

Accordingly, a principal object of the present invention is to provide a semiconductor integrated circuit device in which a drop of breakdown-voltage of the semiconductor integrated circuit device because of the effect of the parasitic MOS transistor is inhibited, while a concentration of the electric field in the major surface of a substrate under the edge of a field plate, affected by electrode wiring, is relieved to make the breakdown-voltage closer to the breakdown-voltage under the condition that the electrode wiring does not traverse the element isolating region.

According to the present invention, since the predetermined voltage is applied to the field plate, a concentration of the electric field is relieved not only at the boundary region between the element isolating region and the major surface of the substrate which the electrode wiring traverses, but also at the major surface of the substrate under the edge of the field plate, which eventually makes it possible to raise the breakdown-voltage of the semiconductor integrated circuit device.

These and other objects, features, aspects and advantages of the present invention will become more apparent from the following detailed description of the present invention when taken in conjunction with the accompanying drawings.

DESCRIPTION OF THE PREFERRED EMBODIMENT

Embodiments according to the present invention will now be described. In the embodiments, a diode is exemplarily used as a semiconductor active element.

Figure 1:
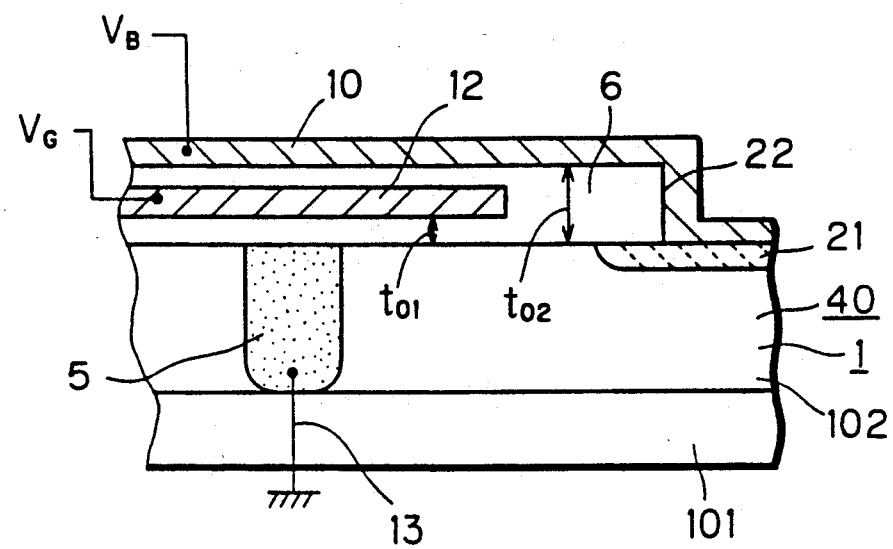
FIG. 1 is a sectional view showing a first embodiment according to the present invention.
Figure 2:
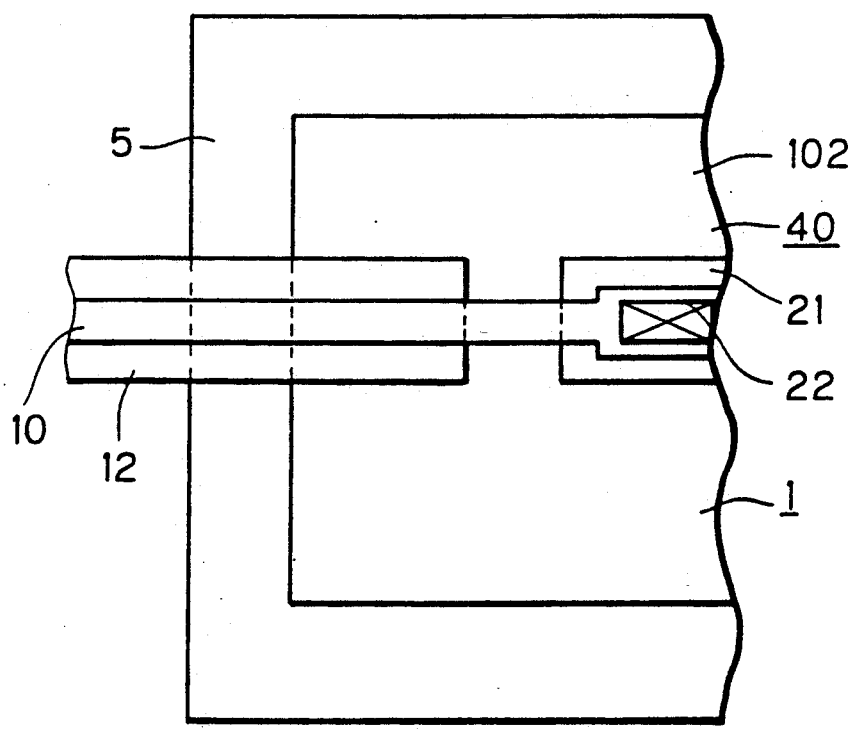
FIG. 2 is a plan view showing the device shown in FIG. 1.

FIG. 1 is a sectional view showing a first embodiment according to the present invention, while FIG. 2 is a plan view of the device shown in FIG. 1.

Referring to FIGS. 1 and 2, a substrate 1 consists of a p+-type semiconductor layer 101 and an n−-type epitaxial layer 102 connected with the p+-type semiconductor layer 101, and an n+-type semiconductor region 21 is disposed in the main surface of the substrate 1. In the substrate 1, an element isolating region 5 of p+-type diffusion layer is disposed surrounding a semiconductor active element 40 to isolate it like an island. An insulation layer 6 is formed on the main surface of the substrate 1 and the element isolating region 5. A contact hole 22 is provided in the insulation layer 6 above the n+-type semiconductor region 21, and electrode wiring 10 is formed on the insulation layer 6 to traverse the element isolating region 5 through the insulation layer 6 while being electrically connected with the semiconductor region 21 through the contact hole 22. A field plate 12 is buried in the insulation layer 6 not to be in contact with the main surface of the substrate 1, blocking from the electrode wiring 10 the element isolating region 5 and the boundary region between the element isolating region 5 and the epitaxial layer 102 which the electrode wiring 10 traverses.

In the semiconductor integrated circuit device thus structured, ordinally the element isolating region 5 is at the lowest potential, i.e. at ground potential. High voltage $V_B$ is applied to the n+-type semiconductor region 21 through the electrode wiring 10. Moreover, voltage $V_G$ is applied to the field plate 12. When the voltage $V_G$ is raised from zero voltage, the breakdown-voltage $V_B$ of the diode device linearly rises. The reason is that the potential on the surface of the epitaxial layer 102 under the field plate 12 rises according to the rise of the voltage $V_G$, so that a concentration of the electric field on the surface of the epitaxial layer 102 under the edge of the field plate 12 becomes to be relieved. In this case, another concentration of the electric field is generated at the boundary region between the element isolating region 5 and the epitaxial layer 102 which the field plate 12 traverses the element isolating region 5. However, the concentration of the electric field at the boundary region is kept in a low state enough to prevent the breakdown while the comparatively low voltage $V_G$ is applied to the field plate 12.

Figure 3:
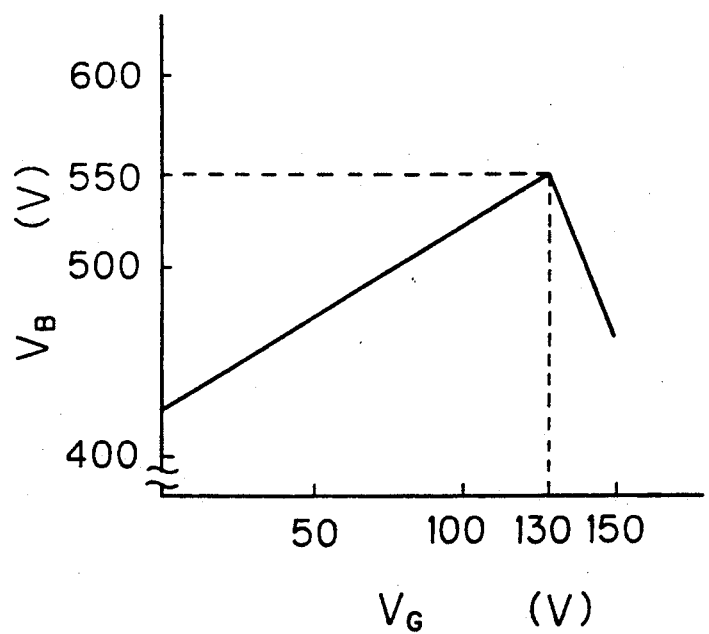
FIG. 3 is a diagram showing the breakdown-voltage when $V_G$ is varied in the device shown in FIG. 1.

For example, when the insulation layer 6 under the field plate 12 has a thickness $t_{01}$ of 1 μm, the insulation layer 6 under the electrode wiring 10 has a thickness $t_{02}$ of 3 μm and the field plate 12 has the voltage $V_G$ of 130 V, the breakdown-voltage is approximately 550 V, and thus, the improvement of the breakdown-voltage is recognized, 120 V up comparing with the conventional device. FIG. 3 shows the breakdown-voltage when the $V_G$ is varied.

Figure 4:
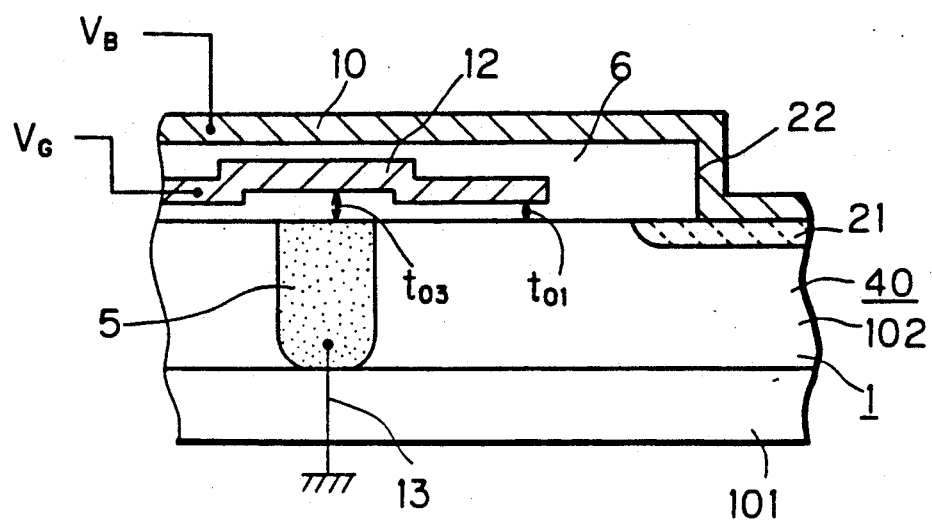
FIG. 4 is a sectional view showing a second embodiment according to the present invention.
Figure 5:
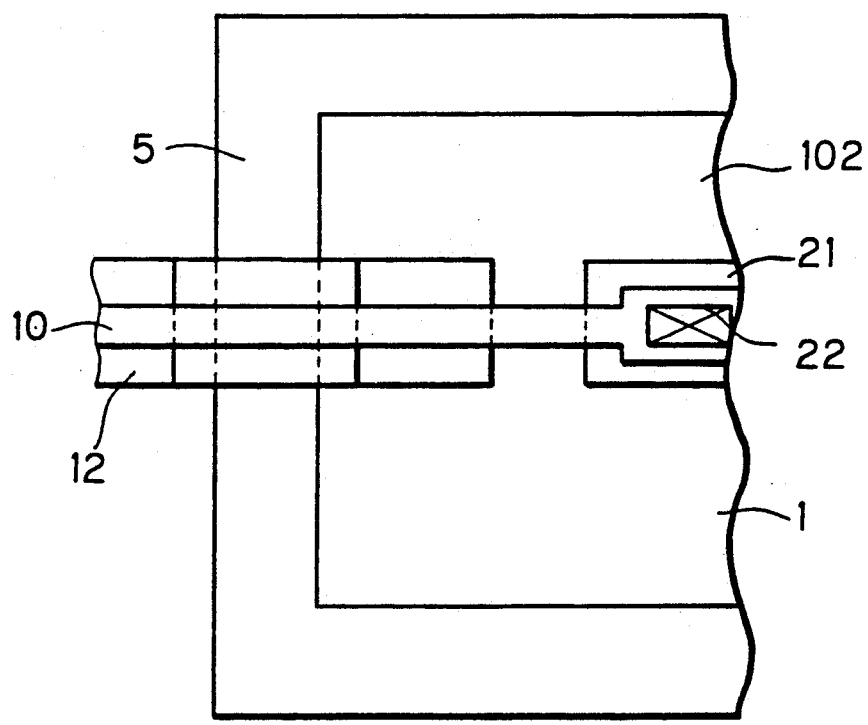
FIG. 5 is a plan view of the device shown in FIG. 4.

FIG. 4 is a sectional view showing a second embodiment, while FIG. 5 is a plan view of the device shown in FIG. 4. In the embodiment shown in FIGS. 1 and 2, when the voltage $V_G$ becomes higher than a certain voltage (130 V in FIG. 3), the position where the breakdown is generated moves from the surface of the $n^-$-type epitaxial layer 102 under the edge of the field plate 12 to the boundary region between the element isolating region 5 and the epitaxial layer 102 under the field plate 12, and the breakdown-voltage rapidly drops as shown in FIG. 3. Then, the device design is improved in that the field plate 12 is shaped in convexity at a position corresponding to the element isolating region 5 and the surface of the epitaxial layer 102 in the vicinity of the element isolating region 5, and the thickness $t_{03}$ of the insulation layer 6 between a region of the field plate 12 shaped in convexity and the element isolating region 5 is thicker than the thickness $t_{01}$ of the insulation layer 6 between the remaining region of the field plate 12 and the surface of the epitaxial layer 102.

Figure 6:
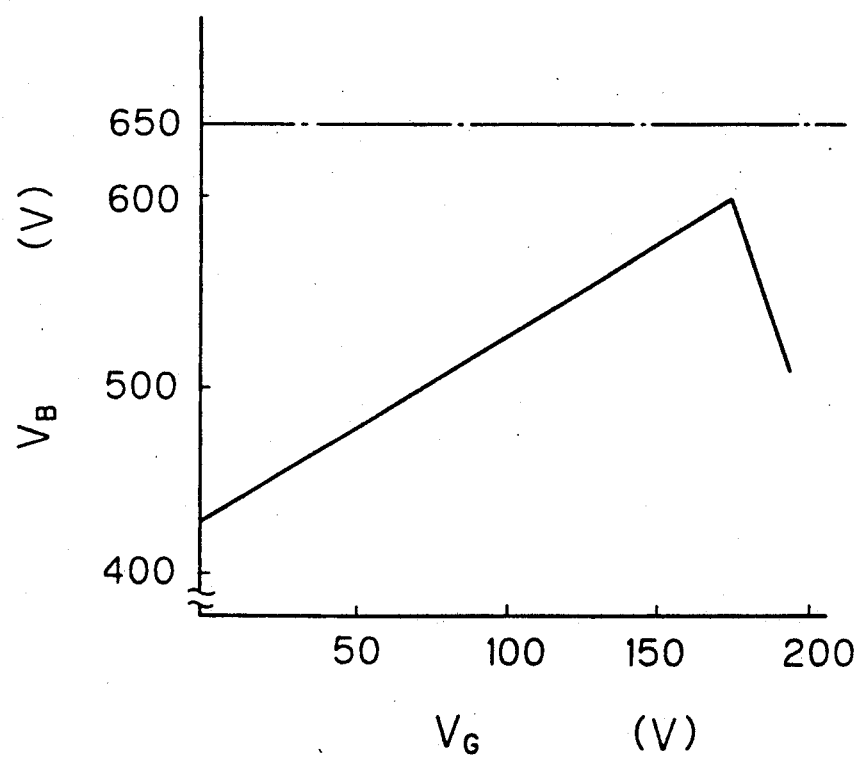
FIG. 6 is a diagram showing the breakdown-voltage when $V_G$ is varied in the device shown in FIG. 4.

In such a structure, since a rise of the potential in the surface of the boundary region between the element isolating region 5 and the epitaxial layer 102 is restricted, the concentration of the electric field in the surface of the boundary region is relieved. Accordingly, breakdown is caused almost simultaneously in the surface of the epitaxial layer 102 under the edge of the field plate 12 and in the surface of the boundary region between the element isolating region 5 and the epitaxial layer 102 which the electrode wiring 10 traverses. Thus, the breakdown-voltage of the semiconductor integrated circuit device can come to be increasingly closer to the breakdown-voltage under the condition that the electrode wiring 10 does not traverse the element isolating region 5. With regard to this structure, FIG. 6 shows the breakdown-voltage when the voltage $V_G$ is varied.

Figure 7:
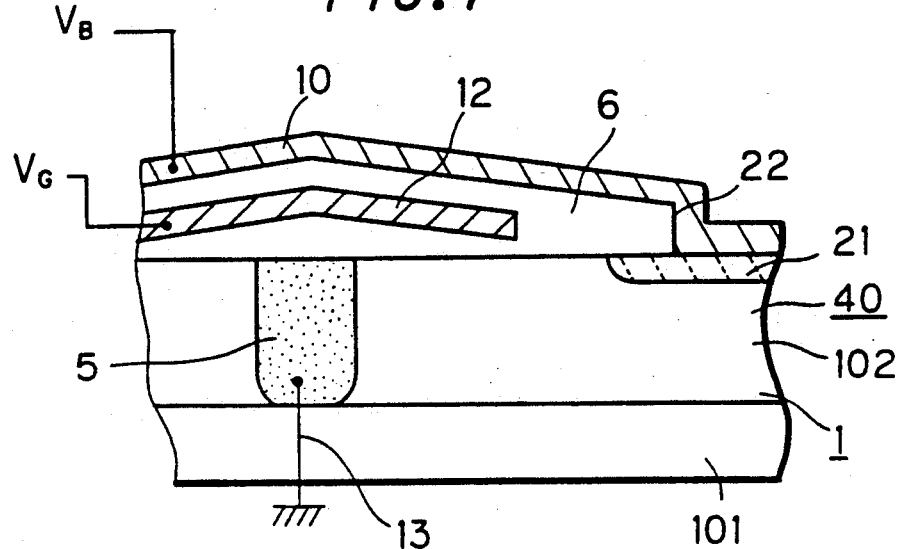
FIG. 7 is a sectional view showing a third embodiment according to the present invention.
Figure 8:
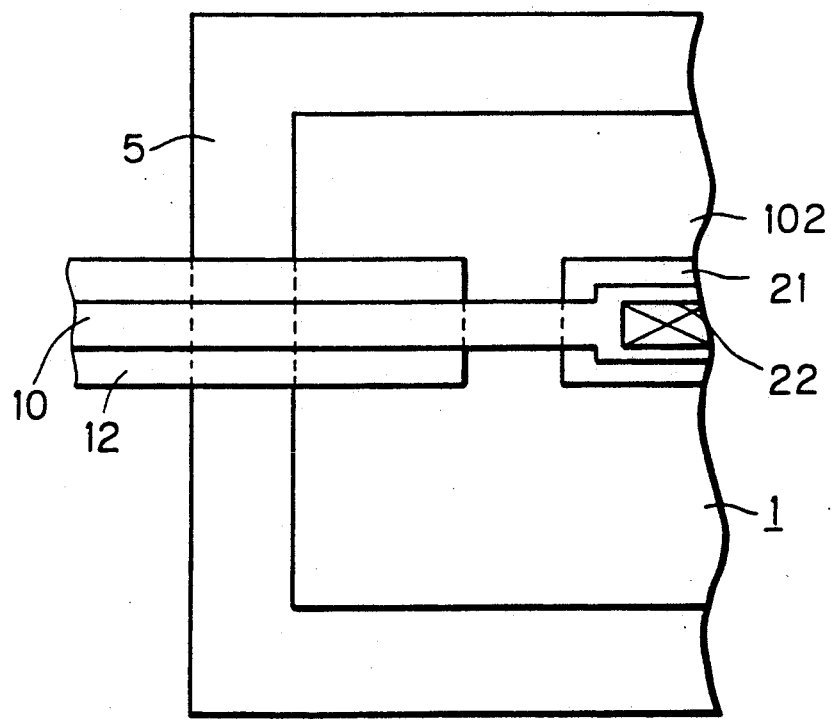
FIG. 8 is a plan view of the device shown in FIG. 7.

As a modification of this structure, the thickness of the insulation layer 6 may be linearly changed as shown in FIGS. 7 and 8. That is, in this device, the field plate 12 is disposed in an inclined state with respect to the surface of the substrate 1, and the thickness of the insulation layer 6 disposed under the field plate 12 is thickest at a position corresponding to the element isolating region 5 and becomes thinner as a position goes away from the element isolating region 5.

Figure 9:
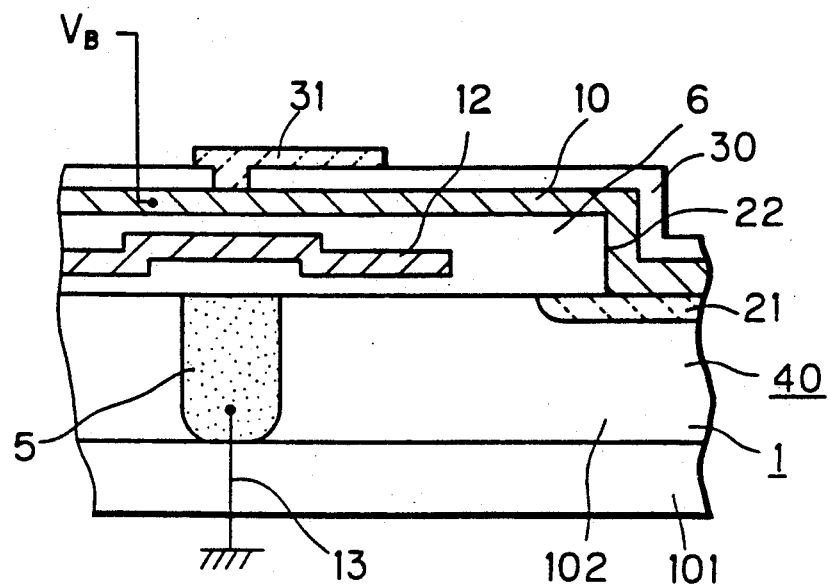
FIG. 9 is a sectional view showing a fourth embodiment according to the present invention.
Figure 10:
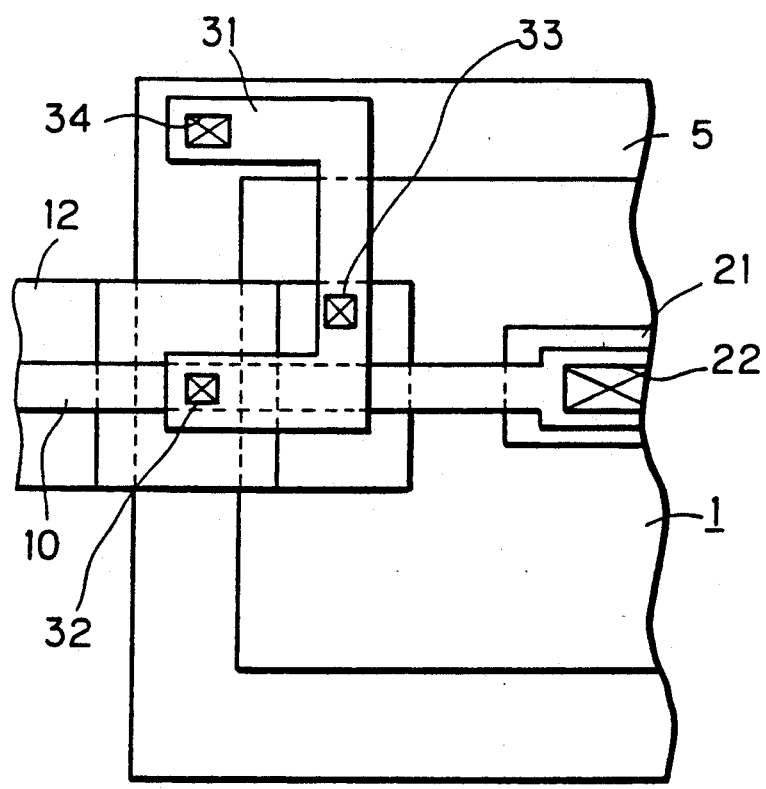
FIG. 10 is a plan view showing the device shown in FIG. 9.
Figure 11:
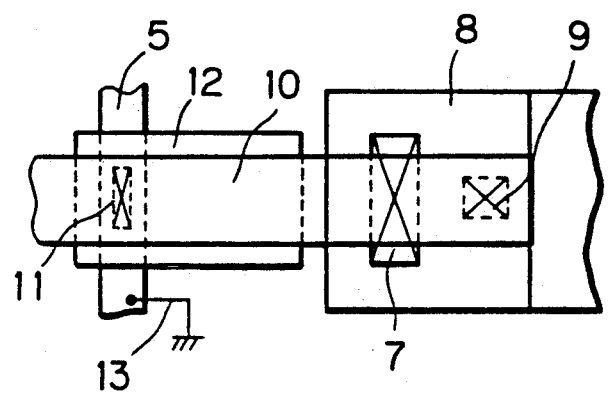
FIG. 11 is a sectional view showing a conventional semiconductor integrated circuit device.
Figure 12:
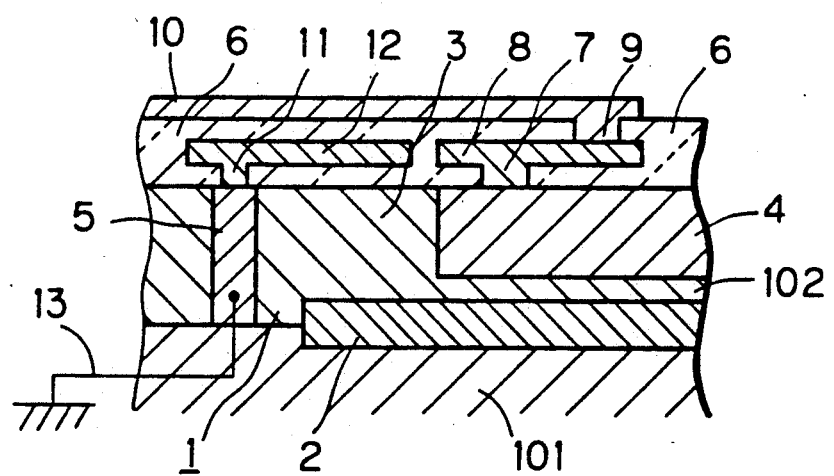
FIG. 12 is a plan view of the device shown in FIG. 11.
Figure 13:
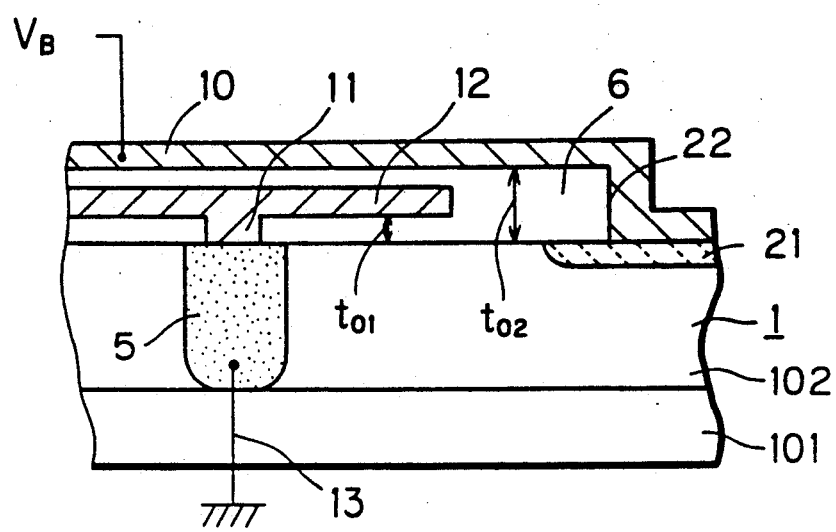
FIG. 13 is a sectional view showing another conventional semiconductor integrated circuit device.
Figure 14:
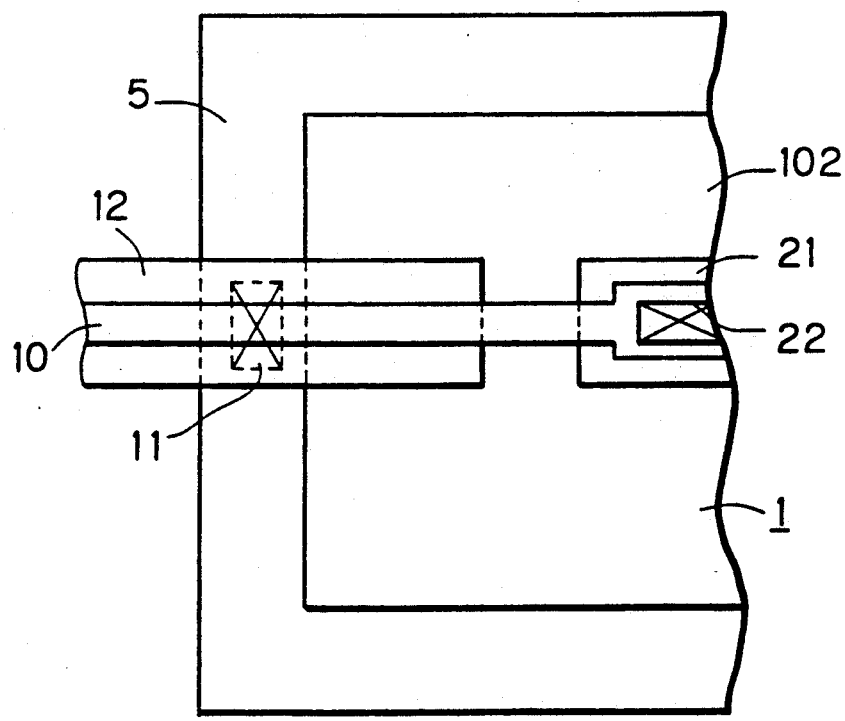
FIG. 14 is a plan view showing the device shown in FIG. 13.
Figure 15:
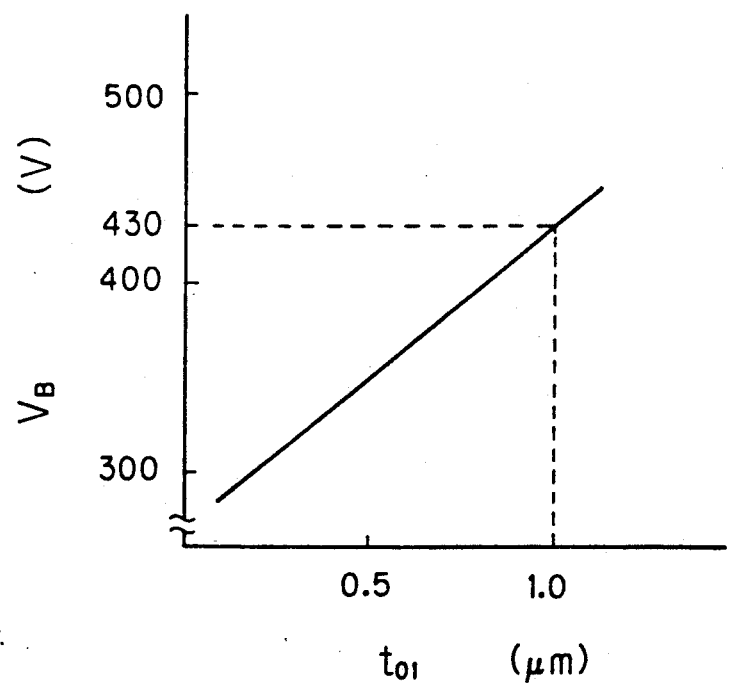
FIG. 15 is a diagram showing the relations between the thickness $t_{01}$ of an insulation layer under a field plate of the device shown in FIG. 13 and the breakdown-voltage.

FIG. 9 is a sectional view showing a fourth embodiment according to the present invention, while FIG. 10 is a plan view of the device shown in FIG. 9.

In FIG. 9, when the element isolating region 5 is at ground potential and the voltage $V_G$ applied to the field plate 12 is desirably a voltage between the voltage $V_B$ of the electrode wiring 10 and the ground potential, the voltage $V_G$ can be set by connecting the electrode wiring 10, the field plate 12 and the element isolating region 5 one another with a resistor 31 as shown in FIGS. 9 and 10. Referring to FIGS. 9 and 10, reference numerals 1, 5, 6, 10, 12, 13, 21, 22, 40, 101 and 102 denote the corresponding parts in FIGS. 4 and 5. An insulation layer 30 is disposed in the surfaces of the electrode wiring 10 and the insulation layer 6, and a resistor 31 is disposed connecting the electrode wiring 10, the field plate 12 and the element isolating region 5 through the insulation layer 30 or together with an insulation layer 6. The resistor 31 is connected to the electrode wiring 10 through a contact hole 32, is connected to the field plate 12 through a contact hole 33, and is connected to the element isolating region 5 through a contact hole 34. In such a structure, when the voltage $V_B$ is applied to the electrode wiring 10 while the element isolating region 5 is grounded, the voltage at the field plate 12 is determined simply by the length of the path of the resistor 31 from the electrode wiring 10 to the field plate 12 and the length of the path of the resistor 31 from the field plate 12 to the element isolating region 5.

Although the pn junction diode device of junction-isolation type has been previously described, the same effect can be obtained in a bipolar transistor device, or in devices having isolation structures, such as dielectric isolation.

Although the present invention has been described and illustrated in detail, it is clearly understood that the same is by way of illustration and example only and is not to be taken by way of limitation. The spirit and scope of the present invention should be limited only by the terms of the appended claims.

What is claimed is:

1. A semiconductor integrated circuit device having a high breakdown-voltage characteristic, said device comprising:
   a substrate having a main surface;
   a semiconductor active element formed in the main surface of said substrate;
   an element isolating region formed in said substrate to surround said semiconductor active element and maintained at a first predetermined voltage;
   an insulation layer formed on the main surface of said substrate and said element isolating region;
   an electrode wiring formed on said insulation layer to traverse said element isolating region through said insulation layer and connected electrically with said semiconductor active element; and a field plate disposed along said electrode wiring in said insulation layer to traverse said element isolating region, said field plate being maintained at a second predetermined voltage different from said first predetermined voltage.

2. A semiconductor integrated circuit device in accordance with claim 1, wherein said field plate is shaped in convexity at a position corresponding to said element isolating region and the major surface of said substrate in the vicinity of said element isolating region, the thickness of said insulation layer between a region of said field plate shaped in convexity and said element isolating region being thicker than that of said insulation layer between the remaining region of said field plate and the major surface of said substrate.

3. A semiconductor integrated circuit device in accordance with claim 1, wherein said field plate is disposed in an inclined state with respect to the major surface of said substrate, and the thickness of said insulation layer disposed under said field plate is thickest at a position corresponding to said element isolating region and becomes thinner as a position goes away from said element isolating region.

4. A semiconductor integrated circuit device in accordance with claim 1, further comprising a resistor connected with said electrode wiring, said field plate and said element isolating region to set the voltage of said field plate to said second predetermined voltage based on a voltage applied to said electrode wiring and said first predetermined voltage applied to said element isolating region.

5. A semiconductor integrated circuit device in accordance with claim 1, wherein said semiconductor active element is a bipolar transistor.

6. A semiconductor integrated circuit device in accordance with claim 1, wherein said semiconductor active element is a diode.

7. A semiconductor integrated circuit device having a high breakdown-voltage characteristic, said device comprising:
   a substrate having a main surface;
   a semiconductor active element formed in the main surface of said substrate;
   an element isolating region formed in said substrate to surround said semiconductor active element;
   an insulation layer formed on the main surface of said substrate and said element isolating region;
   an electrode wiring formed on said insulation layer to traverse said element isolating region through said insulation layer and connected electrically with said semiconductor active element; and
   a field plate disposed along said electrode wiring in said insulation layer to traverse said element isolating region, and receiving a predetermined voltage;
   wherein said field plate is shaped in convexity at a position corresponding to said element isolating region and the major surface of said substrate in the vicinity of said element isolating region, the thickness of said insulation layer between a region of said field plate shaped in convexity and said element isolating region being thicker than that of said insulation layer between the remaining region of said field plate and the major surface of said substrate.

8. A semiconductor integrated circuit device having a high breakdown-voltage characteristic, said device comprising:
   a substrate having a main surface;
   a semiconductor active element formed in the main surface of said substrate;
   an element isolating region formed in said substrate to surround said semiconductor active element;
   an insulation layer formed on the main surface of said substrate and said element isolating region;
   an electrode wiring formed on said insulation layer to traverse said element isolating region through said insulation layer and connected electrically with said semiconductor active element; and
   a field plate disposed along said electrode wiring in said insulation layer to traverse said element isolating region, and receiving a predetermined voltage;
   wherein said field plate is disposed in an inclined state with respect to the major surface of said substrate, and the thickness of said insulation layer disposed under said field plate is thickest at a position corresponding to said element isolating region and becomes thinner at positions away from said element isolating region.

9. A semiconductor integrated circuit device having a high breakdown-voltage characteristic, said device comprising:
   a substrate having a main surface;
   a semiconductor active element formed in the main surface of said substrate;
   an element isolating region formed in said substrate to surround said semiconductor active element;
   an insulation layer formed on the main surface of said substrate and said element isolating region;
   an electrode wiring formed on said insulation layer to traverse said element isolating region through said insulation layer and connected electrically with said semiconductor active element; and
   a field plate disposed along said electrode wiring in said insulation layer to traverse said element isolating region, and receiving a predetermined voltage; and
   a resistor connected with said electrode wiring, said field plate and said element isolating region to set the voltage of said field plate to a level intermediate a voltage applied to said electrode wiring and a voltage applied to said element isolating region.

* * * * *